(12) United States Patent
Chu et al.

(10) Patent No.: US 6,952,175 B2
(45) Date of Patent: Oct. 4, 2005

(54) PHASE DIGITIZER FOR SIGNALS IN IMPERFECT QUADRATURE

(75) Inventors: David C. Chu, Palo Alto, CA (US); Carol Joann Courville, San Jose, CA (US); Lee C. Kalem, Los Gatos, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/668,851

(22) Filed: Sep. 23, 2003

(65) Prior Publication Data

US 2005/0062624 A1 Mar. 24, 2005

(51) Int. Cl.$^7$ .............................................. H03M 1/48
(52) U.S. Cl. .................................................... 341/111
(58) Field of Search ................... 341/111–116; 356/487

(56) References Cited

U.S. PATENT DOCUMENTS

| | | | | |
|---|---|---|---|---|
| 3,825,737 A | * | 7/1974 | Croisier | 708/4 |
| 3,956,623 A | * | 5/1976 | Clark et al. | 708/440 |
| 4,879,527 A | * | 11/1989 | Geile et al. | 331/1 A |
| 5,056,115 A | * | 10/1991 | Meuriche | 375/327 |
| 5,331,400 A | * | 7/1994 | Wilkening et al. | 356/487 |
| 5,663,666 A | | 9/1997 | Chu et al. | |
| 6,480,126 B1 | | 11/2002 | Chu | |
| 6,700,516 B1 | * | 3/2004 | MacDonald | 341/122 |

* cited by examiner

Primary Examiner—Michael Tokar
Assistant Examiner—Khai M. Nguyen (57) ABSTRACT

A method of digitizing first and second signals in imperfect quadrature for obtaining characteristic parameters of the first signal comprises providing a first signal, the first signal comprising an inphase quasi-sinusoidal analog signal. The method comprises providing a second signal, the second signal comprising a quadrature signal. The method comprises digitizing the first signal at a sampling rate, thereby generating a first plurality of sets of digital signal waveform samples and digitizing the second signal at the sampling rate, thereby generating a second plurality of sets of digital signal waveform samples. The method comprises digitally processing successive first and second sets of digital signal waveform samples to generate continually updated digital characteristic parameters representing a characteristic behavior of the first signal.

39 Claims, 4 Drawing Sheets

PHASE DIGITIZER FOR SIGNALS IN IMPERFECT QUADRATURE

THE FIELD OF THE INVENTION

This invention relates generally to systems and methods for digitizing the phase of an analog signal. This invention relates more particularly to a system and method for continuously and accurately digitizing the phase progression of quasi-sinusoidal signals in quadrature based on digitals samples of their waveforms.

BACKGROUND

Many existing phase detectors are analog in nature and have a limited dynamic range. Generally, such phase detectors generate an output voltage indicative of the phase difference between two oscillations that are close in frequency. The polarity of the output voltage indicates which oscillation is leading the other. The magnitude of the output voltage tends to be proportional to the phase difference. The dynamic range of such analog phase detectors is typically limited to one cycle in each direction. Digital phase detection is typically preferred for phase detection of dynamic ranges wider than 1 or 2 cycles.

A prior method of phase digitizing that has very wide dynamic range is described in U.S. Pat. No. 5,663,666, entitled DIGITAL PHASE DETECTOR, by Chu and Sommer. Such a method can be used only on a signal operating within a very narrow frequency band, 100 ppm for example, such as a signal from a crystal oscillator. The method also requires a local oscillator operating at near coherence to the signal.

Another prior method of phase digitizing involves timestamping the zero-crossings of a signal, as described in "Phase Digitizing Sharpens Timing Measurements," David Chu, IEEE Spectrum, July 1988, pp. 28–32. For precise results, such methods usually involve custom time-digitizer circuits, such as described in U.S. Pat. No. 5,166,959, entitled PICOSECOND EVENT TIMER, by Chu and Knotts. Phase digitizing techniques that involve timestamping the zero-crossings of a signal are better suited for agile signals of high frequencies, where signal frequencies may change radically and suddenly, and many zero-crossings are available to generate time-stamp data. A penalty for such a wide-band approach is noise.

In an interferometer arrangement, noise is usually generated from fluctuating beam alignment, turbulence, photodiodes, electronic amplification, and the light source itself. In noisy environments, unexpected spurious zero-crossings may occur due to multiple triggering of the same signal edge, causing a catastrophic failure in previous phase digitizing processes.

In metrology of moving objects, signals are generally quasi-sinusoidal and of limited agility due to the physical inertia of objects being monitored. Frequency of the signal is proportional to the velocity of the object being monitored, and phase of the signal is proportional to the distance of travel. Because physical objects cannot instantaneously jump from one velocity to a much different velocity, the frequency of the signals changes relatively slowly.

The frequency of the signal, although changing slowly, may traverse a wide range, including very low frequencies where the number of zero-crossings available for measurement may be at a premium. Also, the occurrences of zero-crossings are generally non-uniform. This non-uniformity may pose additional difficulty in ascertaining the "data age"—the time between event occurrence and the presentation of its measurement data. These factors render the zero-crossing approach not an optimum technique for phase digitizing for interferometry.

A prior method of phase digitizing for interferometry uses block regression as described in U.S. Pat. No. 6,480,126 entitled PHASE DIGITIZER, by Chu, and assigned to Agilent Technologies, Inc. The described method based on linear regression over an entire time segment, and not just at the vicinity of a zero crossing, is effective in averaging out noise. However, the method cannot be used on a signal operating at a frequency within ±100 kHz. This frequency limit effectively places an upper limit on the velocity of the detected object when the object is moving away from the light source to avoid entering this frequency band.

Therefore, there is a need for a phase digitizing system and method that employs digital signal processing for continuously generating noise-suppressed digital phase data representing the phase of an incoming analog signal, without the disadvantages of previous phase digitizing techniques.

SUMMARY

One aspect of the present invention provides a method of digitizing first and second signals in imperfect quadrature for obtaining characteristic parameters of the first signal. The method comprises providing a first signal, the first signal comprising an inphase quasi-sinusoidal analog signal. The method comprises providing a second signal, the second signal comprising a quadrature signal. The method comprises digitizing the first signal at a sampling rate, thereby generating a first plurality of sets of digital signal waveform samples and digitizing the second signal at the sampling rate, thereby generating a second plurality of sets of digital signal waveform samples. The method comprises digitally processing successive first and second sets of digital signal waveform samples to generate continually updated digital characteristic parameters representing a characteristic behavior of the first signal.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following Detailed Description, therefore, is not to be taken in a limiting sense, and the scope of the present invention is defined by the appended claims.

A displacement measuring interferometry system including phase digitizing is described in this application. Quadrature signal generation from a heterodyne source for use in the interferometry system is also described. In addition, digitized signal processing of the quadrature signal including mathematical treatment of the process and the hardware for performing the process is described. Embodiments of the invention provide a heterodyne interferometer without a low frequency limitation. The quadrature signal allows the frequency to be positive, zero, or negative without hindering phase digitizing.

I. Displacement Measuring Interferometry System

The phase digitizing system and method of the present invention is discussed in the context of a displacement measuring interferometry system. However, the phase digitizing techniques disclosed herein are also applicable to any other application in which it is desirable to continuously generate digital phase data representing the phase of an incoming analog signal.

A typical displacement measuring interferometer system consists of a frequency-stabilized laser light source, interferometer optics and measuring electronics. In metrology based on homodyne interferometry, the phase progression function $\phi(t)$ is directly proportional to the object displacement in time, t, usually by the factor $\lambda/4$. That is, one unit interval (UI) change represents an object movement of one-quarter of the wavelength of the light wave. One UI represents one cycle of the light interference fringe, or $2\pi$ radians. In metrology based on heterodyne interferometry, there are two channels: one Doppler-shifted (Measurement Channel), and the other not shifted (Reference Channel). The difference between the two phase progression functions $\phi_M(t)$ and $\phi_R(t)$ of the two channels is proportional to the object displacement to within an arbitrary constant. The phase progression function for the reference channels is monotonically increasing with time. The phase progression function for the measurement channel increases with time only for positive frequencies, but decreases with time for negative frequencies.

Figure 1:
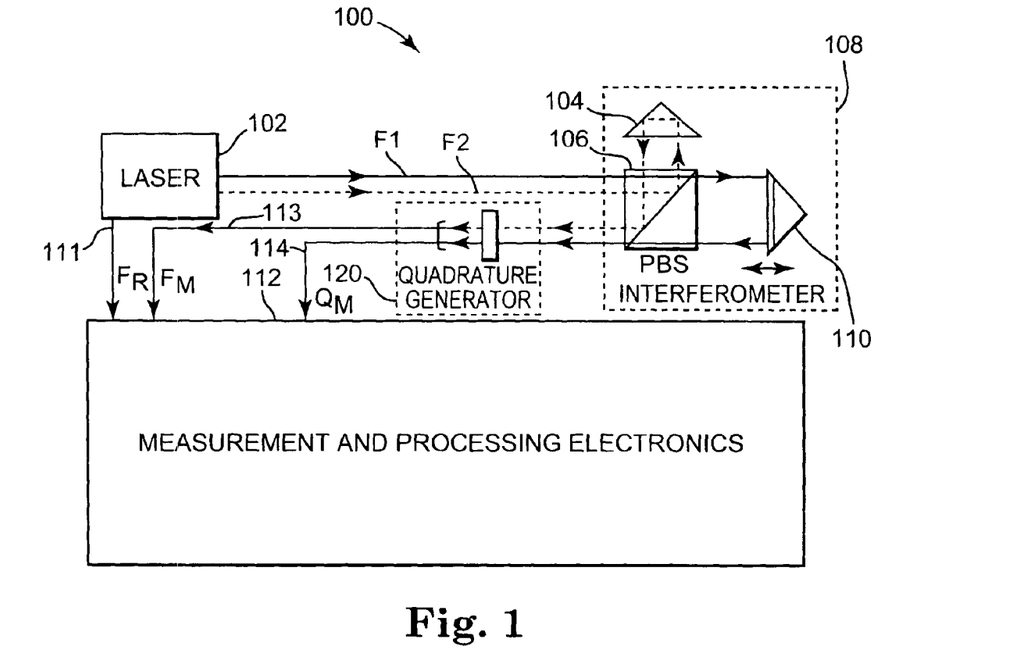
FIG. 1 is a block diagram illustrating an exemplary embodiment of a heterodyne displacement measuring interferometer system.

FIG. 1 is a block diagram illustrating a heterodyne displacement measuring interferometer system 100. Interferometer system 100 includes laser 102, interferometer 108, measurement and processing electronics 112, and quadrature generator 120. Interferometer 108 includes stationary retroreflector 104, polarizing beam splitter (PBS) 106, and movable retroreflector 110.

Laser 102 generates a pair of collinear, orthogonally polarized optical beams of equal intensity and of different frequencies f1 and f2, which differ in frequency by $F_R$, which is a reference frequency. The optical beams pass through interferometer 108. Polarization beam splitter 106 reflects one polarization of the incoming light to stationary retroreflector 104, and passes the other polarization of light to movable retroreflector 110. Retroreflectors 104 and 110 return the light to polarization beam splitter 106, where one beam is transmitted and the other beam is reflected, so that the two beams are again collinear and cobore. Linear motion of movable retroreflector 110 results in a corresponding change in the difference in phase between the two beams. The output beams from interferometer 108 are optically processed in quadrature generator 120 to produce two mixed beams 113 $F_M$ (Inphase) and 114 $Q_M$ (quadrature), both fluctuating in intensity coherently but out of phase. The frequency of fluctuation is in accordance with Doppler shifting of the split-frequency. Both beams are photodetected and processed in measurement and processing electronics 112. A third reference fluctuating beam $F_R$ 111, not Doppler shifted, is phase digitized by a processor similar to one described in U.S. Pat. No. 6,480,126. Either mixed beam is referred to as the measurement signal, and the mixing is represented by the following Equation I:

$$\text{Measurement signal} = \underline{f1} \otimes f2 \qquad \text{Equation I}$$

where:

$\otimes$ indicates a mixing operation; and the underlining of f1 indicates that the signal is Doppler-shifted.

Measurement and processing electronics 112 contain a photodetector that produces an electrical measurement signals corresponding to the optical measurement signals. The measurement signal has a frequency that is equal to the reference frequency $F_R$ plus the Doppler shift frequency:

$$F_M = F_R + n v/\lambda \qquad \text{Equation II}$$

where:

v is the velocity of the interferometer element whose position is being measured (the sign of v indicates the direction of travel);

$\lambda$ is the wavelength of light emitted from laser 102; and n equals 2, 4, etc., depending on the number of passes the light makes through interferometer 108.

In the example system of FIG. 1, the movement of retroreflector 110 produces the Doppler shift and n is equal to 2. The reference signal is produced by mixing the two beams from laser 102 (f1 and f2), which is represented by the following Equation III:

$$\text{Reference Signal} = f1 \otimes f2 \qquad \text{Equation III}$$

Measurement and processing electronics 112 contain a photodetector that produces an electrical reference signal corresponding to the optical reference signal. The reference signal has a frequency that is equal to the reference frequency $F_R$.

Measurement and processing electronics 112 measure the phase difference between the reference signal and the measurement signal, and process the difference to provide position and velocity outputs.

Previous methods for determining and processing phase information employ analog techniques or digital techniques that involved time-stamping the zero-crossings of the signal, or techniques that are of limited frequency range. Embodiments of the present invention provide a more effective technique for generating digitized phase information for interferometry applications such as that shown in FIG. 1, as well as any other application where it is desirable to generate digital phase data representing the instantaneous phase of an incoming analog signal.

One embodiment of the present invention is a method of continuously and accurately digitizing the phase progression of a quasi-sinusoidal signal based on digital samples of its waveform. When the signal comes from a Doppler-shifted light wave reflected from a moving object, possibly down-converted by an interferometer, the signal phase is directly proportional to the position of the object. Therefore, continuous signal phase monitoring is equivalent to continuous position monitoring of the object, accurate to a fraction of the light wavelength.

Phase digitizing of an analog quasi-sinusoidal signal with a low frequency limit of ±100 kHz is described in U.S. Pat. No. 6,480,126, entitled PHASE DIGITIZER, issued Nov. 12, 2002 to Chu and assigned to Agilent Technologies, Inc., and is incorporated herein by reference. To overcome the low frequency limitation, a quadrature, or substantially quadrature signal is generated from light exiting interferometer 108.

In one aspect of the invention, a quasi-sinusoidal inphase signal of unknown and changing frequency, phase, and magnitude is digitized by a first analog-to-digital converter (ADC) at a regular rate greater than twice the bandwidth of the signal. At the same time, a quadrature signal for the inphase signal is digitized by a second ADC at the same rate as the inphase signal. The digitized data from both the inphase and quadrature signals is analyzed in 256-sample segments. For each 256-sample segment, a "best-fit" estimate of the inphase signal is generated of the form V*cos [2π(Freq*i−θ)], and a "best-fit" estimate of the quadrature signal is generated of the form U*sin [2π(Freq*i−θ+Δθ)], where i is an index for identifying consecutive digital signal samples within a segment, V and U represent magnitude estimates of the inphase and quadrature signals respectively, Freq represents a frequency estimate, θ represents a phase-offset estimate, and Δθ represents a phase error estimate.

II. Quadrature Signal Generation from a Heterodyne Source

For quadrature detection of the measurement signal, a second, additional heterodyned signal is generated from the light exiting interferometer 108. The second signal has a phase shift of 90 degrees from the first heterodyned signal. The 90 degree phase shift between heterodyned signals is accomplished by inducing a 90 degree phase shift between the f1 and f2 frequency components in the second beam. This signal is then treated exactly as the first mixed heterodyned signal. The beam is sent through a polarizer and the mixed heterodyned signal is sent to a second detector.

Figure 2:
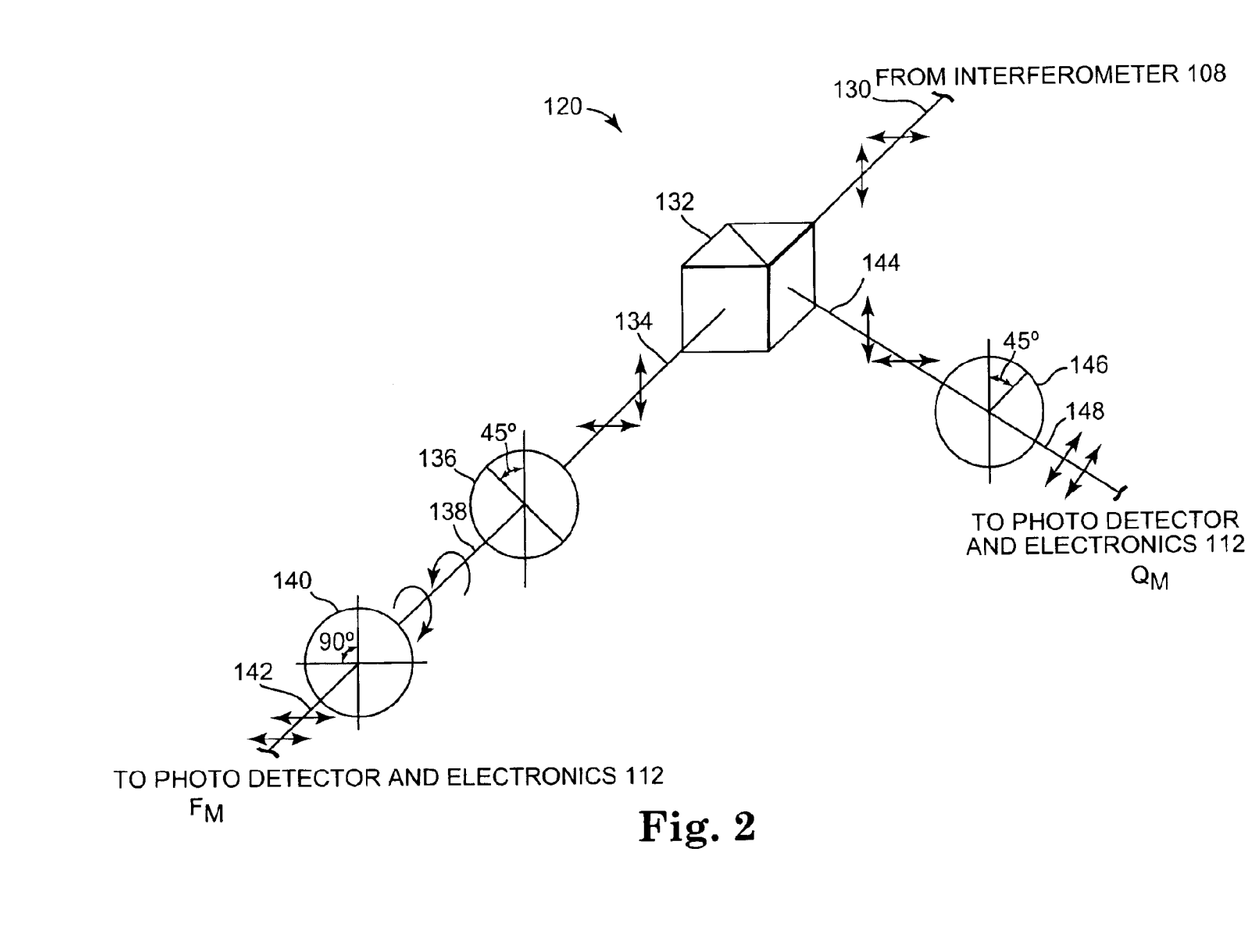
FIG. 2 is a diagram illustrating an exemplary embodiment of optics for generating a quadrature signal for the heterodyne displacement measuring interferometer system.

FIG. 2 is a diagram illustrating the preferred embodiment of quadrature Generator 120. The optics in quadrature generator 120 includes a non-polarizing beam splitter 132, quarter wave plate 136, and two polarizers 140 and 146.

The process for developing the two heterodyned signals is as follows. First, the beam exiting interferometer 108, indicated at 130, is split spatially into two beams, 134 and 144, each with approximately equal amounts of f1 and f2 frequency components using non-polarizing beam splitter 132. The f1 and f2 frequency components in beams 134 and 144 remain orthogonally polarized. In one embodiment, non-polarizing beam splitter 132 is a 50% non-polarizing beam splitter or other suitable non-polarizing beam splitter.

Second, quarter wave plate 136 is inserted in the path of beam 134 such that its fast axis is located at 45 degrees to the orthogonally polarized f1 and f2 frequency components in beam 134. Quarter wave plate 136 changes the orthogonally linearly polarized light beam 134 to orthogonally circularly polarized light beam 138, which is right and left circularly polarized light.

The preceding two steps have produced two beams, 138 and 144 from beam 130 exiting interferometer 108. In beam 144, the f1 and f2 frequency components are in orthogonal and linear polarization states. In beam 138, the f1 and f2 frequency components are in orthogonal and circular polarization states.

Third, both beams 138 and 144 pass through polarizers. Beam 138 passes through polarizer 140 and beam 144 passes through polarizer 146. The polarizer axis of polarizer 146 is oriented at 45 degrees to the orthogonally polarized f1 and f2 frequency components of linearly polarized beam 144.

Mathematical treatment of the signal mixing for beam 144 is as follows. The nomenclature $E_1$ and $E_2$ is assigned to the two linearly polarized components of optical frequencies f1 and f2 respectively. For simplicity, the electric fields of the polarized beams are written in column vectors (Jones Vectors) as follows:

$$E_1 = \begin{bmatrix} Ae^{i(2\pi f_1 t + \delta_1)} \\ 0 \end{bmatrix} \quad \text{Equation IV}$$

$$E_2 = \begin{bmatrix} 0 \\ Ae^{i(2\pi f_2 t + \delta_2)} \end{bmatrix} \quad \text{Equation V}$$

These signals are projected onto polarizer 146 with its polarizer axis oriented at 45 degrees to the orthogonally polarized f1 and f2 frequency components of linearly polarized beam 144.

The Jones Matrix for a polarizer with its polarizer axis oriented at 45 degrees is:

$$P_{45} = \left(\frac{1}{2}\right) * \begin{bmatrix} 1 & 1 \\ 1 & 1 \end{bmatrix} \quad \text{Equation VI}$$

$E_1$ and $E_2$ pass through polarizer 146 and become $E_{1out}$ and $E_{2out}$, where:

$$E_{1out} = \left(\frac{1}{2}\right) * \begin{bmatrix} 1 & 1 \\ 1 & 1 \end{bmatrix} * \begin{bmatrix} Ae^{i(2\pi f_1 t + \delta_1)} \\ 0 \end{bmatrix} \quad \text{Equation VII}$$

$$= \left(\frac{1}{2}\right) * \begin{bmatrix} Ae^{i(2\pi f_1 t + \delta_1)} \\ Ae^{i(2\pi f_1 t + \delta_1)} \end{bmatrix}$$

$$E_{2out} = \left(\frac{1}{2}\right) * \begin{bmatrix} 1 & 1 \\ 1 & 1 \end{bmatrix} * \begin{bmatrix} Ae^{i(2\pi f_2 t + \delta_2)} \\ 0 \end{bmatrix} \quad \text{Equation VIII}$$

$$= \left(\frac{1}{2}\right) * \begin{bmatrix} Ae^{i(2\pi f_2 t + \delta_2)} \\ Ae^{i(2\pi f_2 t + \delta_2)} \end{bmatrix}$$

The sum of $E_{1out}$ and $E_{2out}$ exiting polarizer 146 equals signal 148 as follows:

$$E_{1out} + E_{2out} = \left(\frac{1}{2}\right) * \begin{bmatrix} Ae^{i(2\pi f_1 t + \delta_1)} + Ae^{i(2\pi f_2 t + \delta_2)} \\ Ae^{i(2\pi f_1 t + \delta_1)} + Ae^{i(2\pi f_2 t + \delta_2)} \end{bmatrix} \quad \text{Equation IX}$$

For circularly polarized beam 138, the amount of phase difference between the f1 and f2 frequency components can be varied by the rotational orientation of the polarizer axis of polarizer 140. If the axis of polarizer 140 is aligned with the fast axis of quarter wave plate 136, there is no phase difference between the f1 and f2 frequency components. If the polarizer axis of polarizer 140 is oriented at 45 degrees to the fast axis of quarter wave plate 136, the phase difference is 90 degrees. The general rule is that for every degree of rotation of the polarizer axis of polarizer 140 off from alignment to the fast axis of quarter wave plate 136, the phase difference will increase (or decrease) by two degrees.

Mathematical treatment of the signal mixing for beam 134 is as follows. The nomenclature $E_3$ and $E_4$ is assigned to the two linearly polarized components of optical frequencies f1 and f2 respectively. Beam 134 is changed into circularly polarized components of optical frequencies f1 and f2 respectively as follows:

$$E_3 = \begin{bmatrix} Ae^{i(2\pi f_1 t + \delta_1)} \\ 0 \end{bmatrix} \quad \text{Equation X}$$

$$E_4 = \begin{bmatrix} 0 \\ Ae^{i(2\pi f_2 t + \delta_2)} \end{bmatrix} \quad \text{Equation XI}$$

The Jones Matrix for quarter wave plate 136 with its fast axis set at 45 degrees is:

$$Q_{45} = \left(\frac{1}{\sqrt{2}}\right)\begin{bmatrix} 1 & i \\ i & 1 \end{bmatrix} \quad \text{Equation XII}$$

The Jones Matrix for polarizer 140 with its polarizer axis set at 90 degrees is:

$$P_{90} = \begin{bmatrix} 0 & 0 \\ 0 & 1 \end{bmatrix} \quad \text{Equation XIII}$$

By multiplying equations X, XII, and XIII and equations XI, XII, and XIII, through transformation $E_3$ and $E_4$ become $E_{3out}$ and $E_{4out}$ as follows.

For $E_{3out}$:

$$E_{3out} = \left(\frac{1}{\sqrt{2}}\right) * \begin{bmatrix} 0 & 0 \\ 0 & 1 \end{bmatrix} * \begin{bmatrix} 1 & i \\ i & 1 \end{bmatrix} * \begin{bmatrix} Ae^{i(2\pi f_1 t + \delta_1)} \\ 0 \end{bmatrix} \quad \text{Equation XIV}$$

Equation XIV reduces to:

$$E_{3out} = \left(\frac{1}{\sqrt{2}}\right) * \begin{bmatrix} 0 \\ Ae^{i(2\pi f_1 t + \delta_1 + \pi/2)} \end{bmatrix} \quad \text{Equation XV}$$

For $E_{4out}$:

$$E_{4out} = \left(\frac{1}{\sqrt{2}}\right) * \begin{bmatrix} 0 & 0 \\ 0 & 1 \end{bmatrix} * \begin{bmatrix} 1 & i \\ i & 1 \end{bmatrix} * \begin{bmatrix} 0 \\ Ae^{i(2\pi f_2 t + \delta_2)} \end{bmatrix} \quad \text{Equation XVI}$$

Equation XVI reduces to:

$$E_{4out} = \left(\frac{1}{\sqrt{2}}\right) * \begin{bmatrix} 0 \\ Ae^{i(2\pi f_2 t + \delta_2)} \end{bmatrix} \quad \text{Equation XVII}$$

The sum of $E_{3out}$ and $E_{4out}$ exiting polarizer 140 equals signal 142 as follows:

$$E_{3out} + E_{4out} = \left(\frac{1}{\sqrt{2}}\right) * \begin{bmatrix} 0 \\ Ae^{i(2\pi f_1 t + \delta_1 + \pi/2)} + Ae^{i(2\pi f_2 t + \delta_2)} \end{bmatrix} \quad \text{Equation XVIII}$$

Equations IV–IX show that the heterodyne signal generated from combining $E_{1out}$ and $E_{2out}$ does not add additional phase to the mixed signal, but that combining $E_{3out}$ and $E_{4out}$ through equations X–XVIII does add a 90 degree phase shift between the f1 and f2 frequency components.

Signals 142 and 148 are in imperfect quadrature. Signal 148 is referred to as the inphase signal and signal 142 is referred to as the quadrature signal. Quadrature signal 142 has a phase shift of 90 degrees to inphase signal 148.

III. Digitized Signal Processing

Figure 3:
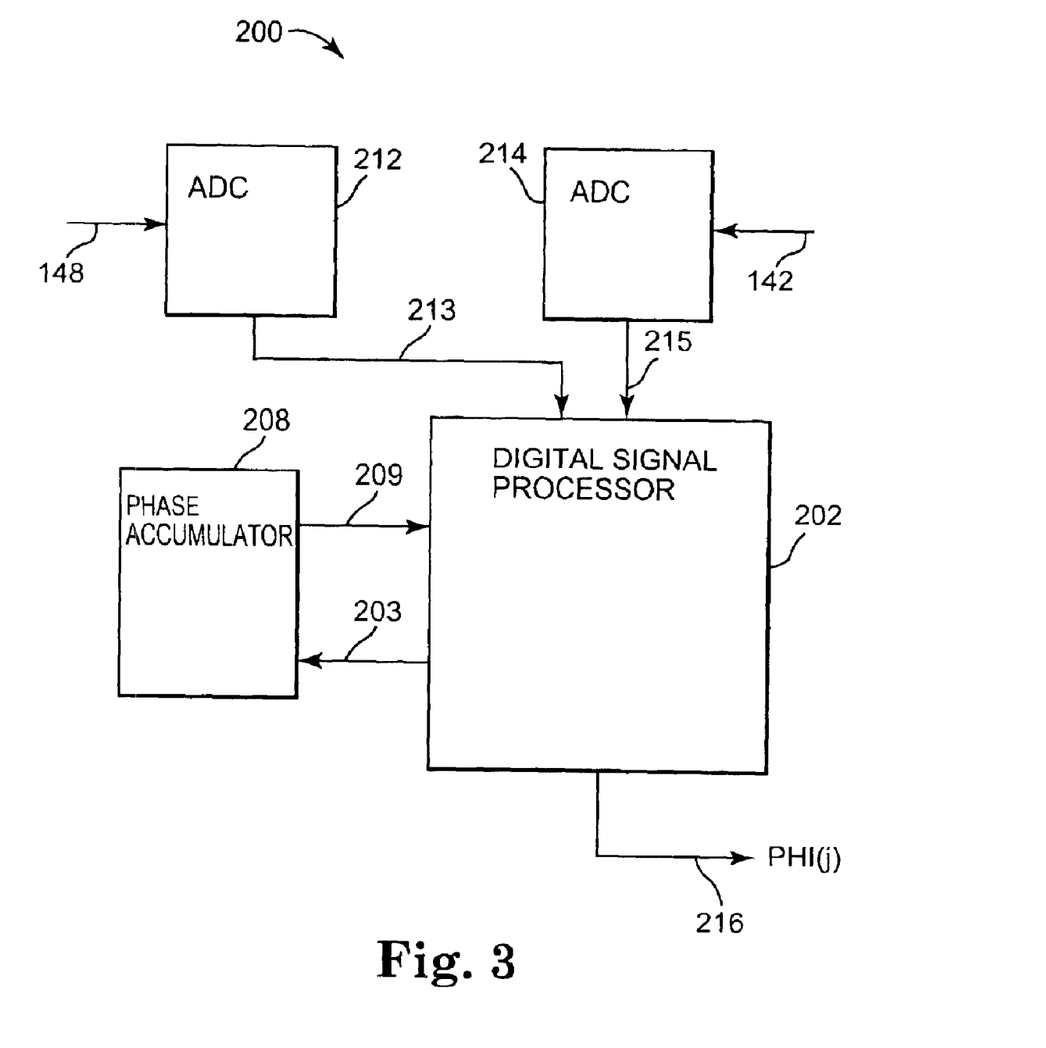
FIG. 3 is an electrical block diagram illustrating an exemplary embodiment of a phase digitizer according to the present invention.

FIG. 3 is a block diagram illustrating an exemplary embodiment of phase digitizer 200. Phase digitizer 200 digitally processes incoming inphase signal V 148 and quadrature signal U 142. Phase digitizer 200 includes analog-to-digital converters (ADCs) 212 and 214, digital signal processor 202, and phase accumulator 208. Phase digitizer 200 uses a block regression technique for phase digitizing in the steady state, wherein linear regression processing is applied to selected sums of the digital signal waveform samples.

Inphase signal V 148 is input to ADC 212 and quadrature signal U 142 is input to ADC 214. ADC 212 is electrically coupled to digital signal processor 202 through data path 213 and ADC 214 is electrically coupled to digital signal processor 202 through data path 215. Phase accumulator 208 is electrically coupled to digital signal processor 202 through path 209. Digital signal processor 202 is electrically coupled to phase-accumulator 208 through path 203 comprising frequency update Freq 220 and phase correction $\theta_{cor}$ 218. Continuous phase output signal Phi(j) 216 is provided by digital signal processor 202, latched at mid-segment by latch 258.

Inphase signal V 148 and quadrature signal U 142 in imperfect quadrature are processed using digital signal processing by phase digitizer 200. ADC 212 samples inphase signal V 148 and ADC 214 samples quadrature signal U 142 and provides the output samples continuously to digital signal processor 202. In one embodiment, ADCs 212 and 214 are 12-bit ADCs and sample inphase signal V 148 and quadrature signal U 142 at 80 MHz. In other embodiments, other suitable sampling rates can be used. In this embodiment, the samples are labeled as vectors V, for inphase signal V 148, and U, for quadrature signal U 142, each of length 256. Each segment is therefore 256/80 MHz or 3.2 μs.

Phase accumulator 208 approximates the signal phase progression $\phi(t_i)$ of incoming inphase signal V 148, where the index "i" indicates an 80-MHz clock count value. Successive $t_i$'s are separated by τ, the period of 80 MHz.

Phase digitizer 200 accurately digitizes the phase progression (in unit intervals UI) of inphase signal V 148 at the 3.2 μs rate regardless of the inphase signal V 148 frequency. The inphase signal V 148 frequency can be positive, negative, near or at zero, or anywhere within the overall measurement range of approximately ±40 MHz.

When the inphase signal V 148 frequency is above approximately +300 kHz or below −300 kHz (referred to as normal frequency range), one vector, V, is used for phase digitizing (as described in U.S. Pat. No. 6,480,126) by digital signal processor 202. Under this normal frequency range, imperfections of U are measured and calibrated by digital signal processor 202. Imperfections, including the magnitude ratio r=|V/U| and phase error Δθ (departure from 90° of quadrature signal U 142 to inphase signal V 148), are relatively constant. These parameters can be exported by digital signal processor 202 and used later in near-zero or at-zero frequency range to minimize errors.

When the inphase signal V 148 frequency is between approximately −300 kHz and +300 kHz (referred to as low frequency range), including zero frequency, both vectors U and V are used for phase digitizing by digital signal processor 202. However, by using calibration data of r and Δθ, exported from previous measurements under normal frequencies, the effect due to imperfections of U are corrected.

The following is the mathematical formulation for phase digitizer 200, including digital signal processor 202. The mathematical model for inphase signal V 148 and quadrature signal U 142 at the 12.5 ns rate (one 80 MHz cycle) is:

$$V_i = V \cos 2\pi(ft_i - \theta) + \text{noise} \quad \text{Equation XIX}$$

$$U_i = U \sin 2\pi(ft_i - \theta + \Delta\theta) + \text{noise} \quad \text{Equation XX}$$

Inphase signal V 148 and quadrature signal U 142 are in imperfect quadrature because U≠V and Δθ≠0. After expansion of cosine and sine equations XIX and XX become:

$$V_i = X_V \cos 2\pi ft_i + Y_V \sin 2\pi ft_i + \text{noise} \quad \text{Equation XXI}$$

$$U_i = X_U \sin 2\pi ft_i + Y_U \cos 2\pi ft_i + \text{noise} \quad \text{Equation XXII}$$

Two 256-length operation vectors E and D are defined, where:

$$E = (e, e, e, \ldots e) \quad \text{Equation XXIII}$$

where e=1 if $0.25 \leq ft_i < 0.50$; e=−1 if $0.75 \leq ft_i < 1.0$; else e=0.

$$D = (d, d, d, \ldots, d) \quad \text{Equation XXIV}$$

where d=1 if $0 \leq ft_i < 0.25$; d=−1 if $0.50 \leq ft_i < 0.75$; else d=0.

Four 256-length data vectors V, U, C, and S are defined, where:

$$V = (V_1, V_2, \ldots, V_{256}), \text{ containing the 256 samples of V.} \quad \text{Equation XXV}$$

$$U = (U_1, U_2, \ldots, U_{256}), \text{ containing the 256 samples of U.} \quad \text{Equation XXVI}$$

$$C = (\cos ft_1, \cos ft_2, \ldots, \cos ft_{256}), \text{ containing cosine table values addressed by } ft_i. \quad \text{Equation XXVII}$$

$$S = (\sin ft_1, \sin ft_2, \ldots, \sin ft_{256}) \text{ containing sine table values addressed by } ft_i. \quad \text{Equation XXVIII}$$

At normal frequencies (i.e. outside ±300 kHz), the 512 equations can be reduced to four equations by E and D operating on V, U, C, and S:

$$(D \cdot V) = X_V(D \cdot C) + Y_V(D \cdot S) \quad \text{Equation XXIX}$$

$$(E \cdot V) = X_V(E \cdot C) + Y_V(E \cdot S) \quad \text{Equation XXX}$$

$$(D \cdot U) = X_U(D \cdot S) - Y_U(D \cdot C) \quad \text{Equation XXXI}$$

$$(E \cdot U) = X_U(E \cdot S) - Y_U(E \cdot C) \quad \text{Equation XXXII}$$

At normal frequencies, computation of V, θ, r=|V/U|, and Δθ is based on 512 equations and four unknowns $X_V, Y_V, X_U$ and $Y_U$. Equations XXIX and XXX and equations XXXI and XXXII are both independent sets and can be used to solve separately for unknowns $X_V, Y_V$ and $X_U, Y_U$ respectively as follows:

$$\begin{bmatrix} X_V \\ Y_V \end{bmatrix} = \begin{bmatrix} (E \cdot S) & -(D \cdot S) \\ -(E \cdot C) & (D \cdot C) \end{bmatrix} \cdot \begin{bmatrix} (D \cdot V) \\ (E \cdot V) \end{bmatrix} \quad \text{Equation XXXIII}$$

$$\begin{bmatrix} X_U \\ Y_U \end{bmatrix} = \begin{bmatrix} -(E \cdot C) & (D \cdot C) \\ -(E \cdot S) & (D \cdot S) \end{bmatrix} \cdot \begin{bmatrix} (D \cdot U) \\ (E \cdot U) \end{bmatrix} \quad \text{Equation XXXIV}$$

Using a four-quadrant actangent function, the parameter $\theta_{cor}$ (in UI) for tracking and phase digitizing signal V is computed as follows:

$$\theta_{cor} = \left(\frac{1}{2\pi}\right) \arctan(X_V, Y_V) \quad \text{Equation XXXV}$$

The calibration parameters r and Δθ (in UI) are computed as follows:

$$r = \left|\frac{V}{U}\right| = \sqrt{\frac{X_V^2 + Y_V^2}{X_U^2 + Y_U^2}} \quad \text{Equation XXXVI}$$

$$\Delta\theta = \left(\frac{1}{2\pi}\right) \text{Arctan}\left(\frac{X_U Y_V - X_V Y_U}{X_V X_U + Y_V Y_U}\right) \quad \text{Equation XXXVII}$$

The calibration parameters r and Δθ are averaged over several segments of 3.2 μs and exported. They are used when the signal frequency becomes low, (i.e. within ±300 kHz). To generate these parameters, the usual determinant for the inversion need not be explicitly computed.

At low frequencies (i.e. within ±300 kHz), equations XXIX–XXXII may not be linearly independent. Both V and U cannot be computed separately with confidence. By using calibration factors r and Δθ, however, the necessary V and $\theta_{cor}$ can be accurately computed. The calibration factor r remains relatively constant even as V and U fluctuate. To equalize the magnitudes, the last two equations (Equations XXXI and XXXII) are multiplied by the calibration factor r exported. To account for the non-ideal skew of the two signals, Δθ is added to the address of the sine and cosine tables by U. These two steps effectively change $(X_u, Y_u)$ to $(X_v, Y_v)$ and create four sums $(D \cdot S)_U$, $(D \cdot C)_U$, $(E \cdot S)_U$, $(E \cdot C)_U$. Thus modified, equations XXXI and XXXII become:

$$r(D \cdot U) = X_V(D \cdot S)_u - Y_V(D \cdot C)_u \quad \text{Equation XXXVIII}$$

$$r(E \cdot U) = X_V(E \cdot S)_u - Y_V(E \cdot C)_u \quad \text{Equation XXXIX}$$

There are two unknowns $X_V$ and $Y_V$ in equations XXIX, XXX, XXXVIII, and XXXIX. The four equations are combined to form two equations XL and XLI as follows for maximum independence:

$$(D \cdot V) + r \cdot (E \cdot U) = X_V[(D \cdot C) + (E \cdot S)_u] + Y_V[(D \cdot S) - (E \cdot C)_M] \quad \text{Equation XL}$$

$$(E \cdot V) - r \cdot (D \cdot U) = X_V[(E \cdot C) - (D \cdot S)_u] + Y_V[(E \cdot S) + (D \cdot C)_M] \quad \text{Equation XLI}$$

The solution to this 2-by-2-equation set in matrix notation is:

$$\begin{bmatrix} X_V \\ Y_V \end{bmatrix} = \begin{bmatrix} (E \cdot S) + (D \cdot C)_u & (E \cdot C)_u - (D \cdot S) \\ (D \cdot S)_u - (E \cdot C) & (D \cdot C) + (E \cdot S)_u \end{bmatrix} \cdot \begin{bmatrix} (D \cdot V) + r \cdot (E \cdot U) \\ (E \cdot V) - r \cdot (D \cdot U) \end{bmatrix} \quad \text{Equation XLII}$$

Finally, using a four-quadrant arctangent function, the low-frequency phase-digitizing parameter $\theta_{cor}$ (in UI) is:

$$\theta_{cor} = \frac{1}{2\pi} \arctan(X_V, Y_V) \quad \text{Equation XLIII}$$

Figure 4:
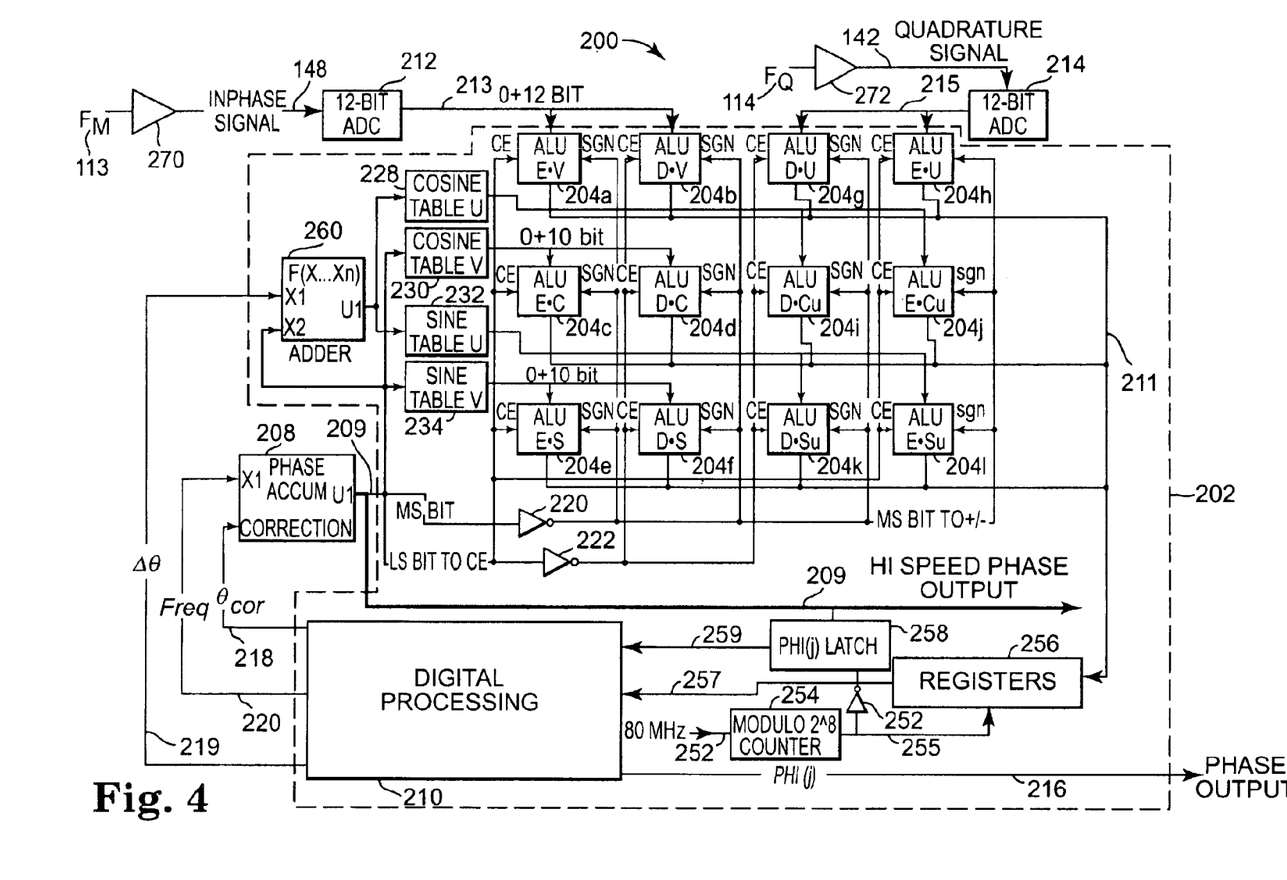
FIG. 4 is an electrical block diagram illustrating the exemplary embodiment of the phase digitizer in greater detail.

FIG. 4 illustrates phase digitizer 200, including digital signal processor 202 illustrated in FIG. 3 in greater detail. Digital signal processor 202 includes arithmetic logic units (ALUs) 204a–204l (collectively referred to as ALUs 204), adder 260, cosine table U 228, cosine table V 230, sine table U 232, sine table V 234, inverters 220 and 222, digital processing block 210, counter 254, latch 258, inverter 252, and registers 256.

ADC 212 is electrically coupled to ALU E·V 204a and ALU D·V 204b. ADC 214 is electrically coupled to ALU D·U 204g and ALU E·U 204h. Cosine table U 228 is electrically coupled to ALU D·C$_U$ 204i and ALU E·C$_U$ 204j. Cosine table V 230 is electrically coupled to ALU E·C 204c and ALU D·C 204d. Sine table U 232 is electrically coupled to ALU D·S$_U$ 204k and ALU E·S$_U$ 204l. Sine table V 234 is electrically coupled to ALU E·S 204e and ALU D·S 204f.

The outputs of ALUs 204 are electrically coupled to registers 256. The output of adder 260 is electrically coupled to cosine table U 228 and sine table U 232. The inputs of adder 260 are electrically coupled to digital processing block 210 through path 219 and the output of phase accumulator 210 through path 209. The output of phase accumulator 208 is electrically coupled to cosine table V 230 and sine table V 234 through path 209. The output of phase accumulator 208 is electrically coupled to the polarity (SGN) inputs of ALUs 204 through path 209 and inverter 220. The output of phase accumulator 208 is electrically coupled to and the clock enable (CE) inputs of ALUs 204a, 204c, 204e, 204h, 204j, and 204l through path 209 and the CE inputs of ALUs 204b, 204d, 204f, 204g, 204i, and 204k through path 209 and inverter 222. The output of phase accumulator 208 is electrically coupled to Phi(j) latch 258 through high speed phase output path 209.

Phi(j) latch 258 is electrically coupled to digital processing block 210 through path 259. Registers 256 are electrically coupled to digital processing block 210 through path 257. Clock signal 252 is input to modulo-$2^8$ counter 254. Modulo-$2^8$ counter 254 is electrically coupled to Phi(j) latch 258 through inverter 252 and to registers 256 through path 255.

The twelve dot products used in equations XXIX through XLIII, (D·V), (D·U), (D·C), (D·S), (E·V), (E·U), (E·C), (E·S), (D·C)$_U$, (D·S)$_U$, (E·C)$_U$, (E·S)$_U$, are synthesized by hardware at high speed by ALUs 204 by the same names.

In one embodiment, the digital circuits shown in FIG. 4 are clocked synchronously at an 80 MHz rate. The clocking circuit is omitted from FIG. 4 to simplify the illustration of the invention.

ADCs 212 and 214 are 12-bit ADCs that digitize at 80 MHz the incoming inphase signal 148 from photodetector 270 of unknown magnitude, frequency, and phase and incoming quadrature signal 142 from photodetector 272, respectively. In alternative embodiments, other sampling rates can be used. The output of ADC 212 is monitored simultaneously by two ALUs 204a and 204b. The output of ADC 212 is represented by V from equation XXV. The output of ADC 214 is monitored simultaneously by two ALUs 204g and 204h. The output of ADC 214 is represented by U from equation XXVI.

In one embodiment, phase accumulator 208 is a 42-bit phase accumulator and approximates the signal phase progression $\phi(t_i)$ of incoming inphase signal 148, where the index "i" indicates a clock count value. Successive $t_i$'s are separated by $\tau$, the period of 80 MHz. The most significant 25 bits of phase accumulator 208 represent the numbers of whole UI in $\phi(t_i)$, and the remaining 17 bits represent fractional UI in $\phi(t_i)$. The increment value of phase accumulator 208, Freq, indicated at 220, is the latest estimate of the signal frequency expressed in UI/$\tau$.

In one embodiment, the most significant 8 bits of the fractional output of phase accumulator 208 are used to address cosine table V 230 and sine table V 234. Tables 230 and 234 each span one complete period in the 8-bit address space. Therefore, there are 256 entries that span one period in each table 230 and 234. In one embodiment, each entry in tables 230 and 234 is 10 bits wide. The output of cosine table V 230 is presented to ALU 204c and ALU 204d. The output of cosine table V 230 is represented by C from equation XXVII. The output of sine table V 234 is presented to ALU 204e and ALU 204f. The output of sine table V 234 is represented by S from equation XXVIII.

The most significant 8 bits of the fractional output of phase accumulator 208 are modified by $\Delta\theta$ in adder 260 to create the dot products with U-suffixes. The output of adder 260 is used to address cosine table U 228 and sine table U 232. Tables 228 and 232 each span one complete period in the 8-bit address space. Therefore, there are 256 entries that span one period in each table 228 and 232. Each entry in tables 228 and 232 is 10 bits wide. The output of cosine table U 228 is presented to ALU 204i and ALU 204j. The output of sine table U 232 is presented to ALU 204k and ALU 204l. The output of cosine table U 228 and sine table U 232 is first used in equation XXXVIII.

The two most significant bits of the fractional part of the output of phase accumulator 208 determine the quadrants and control the operations of the twelve ALUs 204. The two most significant bits enable or disable the twelve ALUs 204 and assign the polarity of accumulation for the enabled units as shown in the following Table I:

TABLE I

| bits | Name | Action |
|---|---|---|
| 00 | 1$^{st}$ quadrant | ALUs 204b, 204d, 204f, 204g, 204i, and 204k are enabled to increment, ALUs 204a, 204c, 204e, 204h, 204j, and 204l are disabled |
| 01 | 2$^{nd}$ quadrant | ALUs 204a, 204c, 204e, 204h, 204j, and 204l are enabled to increment, ALUs 204b, 204d, 204f, 204g, 204i, and 204k are disabled |
| 10 | 3$^{rd}$ quadrant | ALUs 204b, 204d, 204f, 204g, 204i, and 204k are enabled to decrement, ALUs 204a, 204c, 204e, 204h, 204j, and 204l are disabled |
| 11 | 4$^{th}$ quadrant | ALUs 204a, 204c, 204e, 204h, 204j, and 204l are enabled to decrement, ALUs 204b, 204d, 204f, 204g, 204i, and 204k are disabled |

The operation of Table I is represented by the operational vectors E and D, defined in equations XXIII and XXIV. The CE inputs of ALUs 204 are enabled when there is a need to add or to subtract and the CE inputs of ALUs 204 are disabled when E or D should do nothing (i.e. when e=0 or d=0).

In one embodiment, the digitized data from ADCs 212 and 214 is analyzed in 256-sample segments. Modulo-$2^8$ counter 254 sequences the events in each 256-clock segment. At the negative transition of counter 254, halfway into a segment, 16 bits of output of phase accumulator 208 (6 bits of whole UI and 10 bits of fractional UI) are latched by Phi(j) latch 258. The latched value represents a temporary mid-segment value, Phi(j), which is held in reserve to be modified at the end of the segment. The letter "j" is an index for identifying segments.

At the positive transition of counter 254 at the end of a segment, the outputs of the twelve ALUs 204 are latched into twelve registers 256, omitting the 4 least significant bits. The latched values are E·V, D·V, E·C, D·C, E·S, D·S, D·U, E·U, D·C$_U$, E·C$_U$, D·S$_U$, and E·S$_U$, which are associated with ALUs 204a, 204b, 204c, 204d, 204e, 204f, 204g, 204h, 204i, 204j, 204k, and 204l, respectively. Immediately after the values are latched, all twelve ALUs 204 are reset to zero (reset circuit not shown for clarity purposes) so that ALUs 204 are ready for the next segment.

The latched values of the twelve ALUs 204 are digitally processed by digital processing block 210 as shown in the following Equations XLIV through LVIII:

The temporary mid-segment value Phi(j) latched by Phi(j) latch 258 is now corrected by a computed parameter $\theta_{cor}$ as follows:

$$Phi(j)=Phi(j)-\theta_{cor} \quad \text{Equation XLIV}$$

Simultaneously, the current value φ of the phase accumulator 208 is also corrected by computed parameter $\theta_{cor}$ as follows:

$$\phi = \phi - \theta_{cor} \qquad \text{Equation XLV}$$

The corrected Phi(j), together with 320 values from past segments, are stored in memory and exported as measured phase progression values. An updated frequency value, Freq, under steady state, is derived from the current value Phi(j) and one historical value Phi(j−1) recorded one segment ago. One embodiment of the formulation for the new steady-state Freq is:

$$Freq = [Phi(j) - Phi(j-1)]/256 \qquad \text{Equation XLVI}$$

Exporting Phi(j) completes the tracking and phase digitizing process, which is the same for all frequencies, including normal, low, positive, zero or negative frequency. However, how computed parameter $\theta_{cor}$ is computed depends on the signal frequency.

As previously described, there are two basic modes of operation, including operation at normal frequencies and operation at low frequencies. No special consideration is necessary to handle positive and negative frequencies. The generation of dot products by ALUs 204 and phase tracking and correction by computed parameter $\theta_{cor}$ are the same for either mode. The following equations XLVII through LVIII show how the dot products from ALUs 204 are used to generate the phase correction computed parameter $\theta_{cor}$ in each mode during digital processing in digital processing block 210.

Normal Frequencies: Outside ±300 kHz (i.e. Freq Outside ±0.00375)

In this mode, four dot products $D \cdot C_U$ from ALU 204i, $D \cdot S_U$ from ALU 204k, $E \cdot C_U$ from ALU 204j, and $E \cdot S$ from ALU 204l are not used.

Four intermediate parameters Xv, Yv, Xu, Yu are derived from the remaining eight dot products as follows:

$$X_V = (E \cdot S)(D \cdot V) - (D \cdot S)(E \cdot V) \qquad \text{Equation XLVII}$$

$$Y_V = (D \cdot C)(E \cdot V) - (E \cdot C)(D \cdot V) \qquad \text{Equation XLVIII}$$

$$X_U = (D \cdot C)(D \cdot U) - (E \cdot C)(E \cdot U) \qquad \text{Equation XLIX}$$

$$Y_U = (D \cdot S)(E \cdot U) - (E \cdot S)(D \cdot U) \qquad \text{Equation L}$$

The two quadrature calibration factors Δθ(in UI) and r (using the principal arctangent function) are computed from these intermediate parameters as follows:

$$\Delta\theta = \left(\frac{1}{2\pi}\right) \text{Arctan}[(X_U Y_V - X_V Y_U)/(X_U X_V + Y_V Y_U)] \qquad \text{Equation LI}$$

$$r = [V/U] = \sqrt{\frac{X_V^2 + Y_V^2}{X_U^2 + Y_U^2}} \qquad \text{Equation LII}$$

Low Frequencies: Inside ±300 kHz (i.e. Freq Inside ±0.00375)

At low frequencies, no new quadrature calibration factors r and Δθ are generated. Instead, the factors last produced are used to improve accuracy. The factor Δθ is added to the phase value φ by adder 260. The sum (fractional part) is used to address cosine table U 228 and sine table U 232. The results of these tables provide input to ALUs $D \cdot C_U$ 204i, $E \cdot C_U$ 204j and $D \cdot S_U$ 204k, $E \cdot S_U$ 204l, respectively, as shown in FIG. 4. Previously generated parameter r is used, in conjunction with all 12 dot products, to produce two intermediate parameters $X_V$ and $Y_V$ as follows:

$$X_V = (E \cdot S + D \cdot C_U)(D \cdot V + rE \cdot U) + (E \cdot C_U - D \cdot S)(E \cdot V - rD \cdot U) \qquad \text{Equation LIII}$$

$$Y_V = (D \cdot S_U - E \cdot C)(D \cdot V + rE \cdot U) + (D \cdot C + E \cdot S_U)(E \cdot V - rD \cdot U) \qquad \text{Equation LIV}$$

All Frequencies: Inside ±39.7 MHz (i.e. Freq Inside ±0.49625)

Regardless of the computation of intermediate parameters $X_V$ and $Y_V$ in either the normal or low frequency mode, the phase correction computerized parameter $\theta_{cor}$ is computed using the four-quadrant arctangent function as follows:

$$\theta_{cor} = \left(\frac{1}{2\pi}\right) \text{arctan}(X_V, Y_V) \qquad \text{Equation LV}$$

In either normal or low frequency mode, the magnitude estimate of inphase signal V 148 is formally given by:

$$V = \sqrt{X_V^2 + Y_V^2}/det \qquad \text{Equation LVI}$$

However, the computation for $X_V$ and $Y_V$, is signal frequency dependent as previously described. The computation of the determinant is also signal frequency dependent. For normal frequencies, the determinant is:

$$det = (E \cdot S)(D \cdot C) - (D \cdot S)(E \cdot C) \qquad \text{Equation LVII}$$

For low frequencies, the determinant is:

$$det = (D \cdot C + E \cdot S_U)(E \cdot S + D \cdot C_U) + (E \cdot C_U - D \cdot S)(E \cdot C - D \cdot S_U) \qquad \text{Equation LVIII}$$

In one form of the invention, digital processing block 210 is implemented as a field programmable gate array (FPGA). In an alternative embodiment, digital processing block 210 is implemented as a DSP processor.

In one embodiment, as soon as computation of $\theta_{cor}$ and Freq values is completed by digital processing block 210, the increment value of phase accumulator 208 is modified by digital processing block 210 to Freq−$\theta_{cor}$ for one clock cycle, then to Freq for the next 255 clock cycles. The value of Freq, which is no larger than ½, should be carried to a precision of 17 bits.

The above process is then repeated for the next 256-sample segment. Throughout the process, the clocked phase accumulator 208 output φ(t_i) serves as a good digitized representation of the phase progression of the incoming inphase signal 148 to 25 bits of whole numbers and 10 bits of fractional numbers.

The embodiments of the invention described herein, including generating a quadrature signal and phase digitizing the quadrature signal, provide a heterodyne interferometer without a low frequency limitation. The quadrature signal allows the frequency to be positive, zero, or negative without hindering phase digitizing. At normal frequencies, the inphase signal is used to determine the phase progression and parameters representing the imperfections of the quadrature signal are measured and exported. At low frequencies, both the inphase and quadrature signals waveform samples and the exported parameters are used to determine the phase progression.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of digitizing first and second signals in imperfect quadrature for obtaining characteristic parameters of the first signal, the method comprising:

providing a first signal, the first signal comprising an inphase quasi-sinusoidal analog signal;

providing a second signal, the second signal comprising a quadrature signal;

digitizing the first signal at a sampling rate, thereby generating a first plurality of sets of digital signal waveform samples;

digitizing the second signal at the sampling rate, thereby generating a second plurality of sets of digital signal waveform samples; and digitally processing successive first and second sets of digital signal waveform samples to generate continually updated digital characteristic parameters representing a characteristic behavior of the first signal, wherein digitally processing successive first and second sets of digital signal waveform samples is based on a block regression technique.

2. The method of claim 1, wherein the digital characteristic parameters comprise a phase progression of the first signal.

3. The method of claim 1, wherein the digital characteristic parameters comprise a phase-offset correction of the first signal.

4. The method of claim 1, wherein the digital characteristic parameters comprise a magnitude estimate of the first signal.

5. The method of claim 1, wherein the digital characteristic parameters comprise a frequency estimate of the first signal.

6. The method of claim 1, wherein each first and second sets of digital signal waveform samples include integer power of 2 number of samples.

7. The method of claim 1, wherein the sampling rate is 80 MHz.

8. The method of claim 1, wherein the step of digitally processing successive first and second sets of digital signal waveform samples further comprises:

generating a first best-fit estimate of the first signal for each first set of digital signal waveform samples; and generating a second best-fit estimate of the second signal for each second set of digital signal waveform samples.

9. The method of claim 8, wherein the best-fit estimate of the first signal is determined by an equation $V*\cos[2\tau(Freq*i-\theta)]$, wherein i is an index for identifying consecutive digital signal waveform samples within a set, V represents a magnitude estimate, Freq represents a frequency estimate, and $\theta$ represents a phase-offset estimate.

10. The method of claim 8, wherein the best-fit estimate of the second signal is determined by an equation $U*\sin[2\tau(Freq*i-\theta+\Delta\theta)]$, wherein i is an index for identifying consecutive digital signal waveform samples within a set, U represents a magnitude estimate, Freq represents a frequency estimate, $\theta$ represents a phase-offset estimate, and $\Delta\theta$ represent a phase error.

11. The method of claim 1, wherein the frequency of the first signal is outside a range of approximately −300 kHz to +300 kHz.

12. The method of claim 11, wherein the step of digitally processing successive first and second sets of digital signal waveform samples further comprises:

calculating calibration factors magnitude ratio $|V/U|$ and phase error $\Delta\theta$ to use in digitally processing successive first and second sets of digital signal waveform samples if a frequency of the first signal moves to within a range of approximately −300 kHz to +300 kHz, where V is the magnitude of the first signal and U is the magnitude of the second signal.

13. The method of claim 1, wherein a frequency of the first signal is within a range of approximately −300 kHz to +300 kHz.

14. The method of claim 1, wherein linear regression processing is applied to selected sums of the digital signal waveform samples.

15. A phase digitizing system comprising:

a first analog-to-digital converter for generating a first plurality of segments of digital signal waveform samples based on an incoming first signal;

a second analog-to-digital converter for generating a second plurality of segments of digital signal waveform samples based on an incoming second signal;

a digital phase accumulator; and a digital signal processor coupled to the first and second analog-to-digital converters and the digital phase accumulator for digitally processing each first and second segments of the digital signal waveform samples together with an output of the phase accumulator and for continually generating digital phase data, the digital signal processor configured to provide increment values to the digital phase accumulator based on the digital phase data, thereby causing the output of the digital phase accumulator to represent an instantaneous phase of the incoming first signal;

wherein the digital phase accumulator is configured to generate a plurality of digital phase progression values based on current frequency values and current phase correction values.

16. The phase digitizing system of claim 15, wherein the digital phase data includes a phase correction value.

17. The phase digitizing system of claim 15, wherein the digital phase data includes a frequency update value.

18. The phase digitizing system of claim 15, wherein the digital phase data includes a magnitude estimate of the incoming first signal.

19. The phase digitizing system of claim 15, wherein the digital phase data includes a magnitude estimate of the incoming second signal.

20. The phase digitizing system of claim 15, wherein each first and second segment of digital signal waveform samples includes a number of digital signal waveform samples equaling an integer power of 2.

21. The phase digitizing system of claim 15, wherein the first and second analog-to-digital converters generate digital signal waveform samples at 80 MHz.

22. The phase digitizing system of claim 15, wherein the incoming first signal is an inphase signal.

23. The phase digitizing system of claim 15, wherein the incoming second signal is a quadrature signal.

24. The phase digitizing system of claim 15, wherein each digital phase progression value includes a whole number portion and a fractional number portion.

25. The phase digitizing system of claim 24, wherein the digital signal processor further comprises:

a first cosine table coupled to the digital phase accumulator for providing cosine values corresponding to the fractional number portion of the digital phase progression values;

a first sine table coupled to the digital phase accumulator for providing sine values corresponding to the fractional number portion of the digital phase progression values;

a first plurality of arithmetic logic units (ALUs) for arithmetically processing the first cosine values and the first sine values, each ALU in the first plurality of ALUs configured to output a result value based on the arithmetic processing; and a second plurality of ALUs coupled to the first analog-to-digital converter for arithmetically processing the first digital signal waveform samples, each ALU in the second plurality of ALUs configured to output a result value based on the arithmetic processing, wherein the digital signal processor is configured to generate the current phase correction values based on the result values output by the first and the second plurality of ALUs, and configured to generate each current frequency value based on a current digital phase value and a plurality of past digital phase values.

26. The phase digitizing system of claim 25, further comprising:

an adder coupled to the digital signal processor, the adder configured to provide feedback to the digital signal processor to correct for phase error.

27. The phase digitizing system of claim 26, wherein the digital signal processor further comprises:

a second cosine table coupled to the adder for providing cosine values corresponding to the fractional portion of the digital phase progression values modified by a phase error;

a second sine table coupled to the adder for providing sine values corresponding to the fractional portion of the digital phase progression values modified by a phase error;

a third plurality of arithmetic logic units (ALUs) for arithmetically processing the second cosine values and the second sine values, each ALU in the third plurality of ALUs configured to output a result-value based on the arithmetic processing; and a fourth plurality of ALUs coupled to the second analog-to-digital converter for arithmetically processing the second digital signal waveform samples, each ALU in the fourth plurality of ALUs configured to output a result value based on the arithmetic processing, wherein the digital signal processor is configured to generate the current phase correction values based on the result values output by the first, second, third and the fourth plurality of ALUs, and configured to generate each current frequency value based on a current digital phase value and a plurality of past digital phase values.

28. The phase digitizing system of claim 27, wherein the digital signal processor further comprises:

a plurality of registers coupled to the ALUs for storing the result values.

29. The phase digitizing system of claim 28, wherein the digital signal processor further comprises:

a latch coupled to the digital phase accumulator for latching a digital phase progression value.

30. The phase digitizing system of claim 29, wherein the digital signal processor further comprises:

a counter coupled to the plurality of registers and the latch, the counter configured to cause the registers to store the result values at an end of each segment of first and second digital signal waveform samples, the counter configured to cause the latch to latch a phase progression value substantially near a center of each segment of first and second digital signal waveform samples.

31. The phase digitizing system of claim 30, wherein the digital signal processor is configured to generate each current digital phase value by subtracting a current phase correction value from the latched phase progression value.

32. A displacement measuring interferometry system comprising:

a light source for generating at least one light beam;

an interferometer for generating an optical measurement signal based on the at least one light beam;

optics for generating a quadrature optical measurement signal based on the optical measurement signal;

a receiver for receiving the quadrature optical measurement signal and an optical reference signal, the receiver configured to generate an analog measurement signal based on the quadrature optical measurement signal and configured to generate an analog reference signal based on the optical reference signal;

at least two analog-to-digital converters for generating a first plurality of sets of digital measurement signal waveform samples based on an inphase portion of the measurement signal, and for generating a second plurality of sets of digital measurement signal waveform samples based on a quadrature portion of the measurement signal, the at least two analog-to-digital converters configured to generate a plurality of sets of digital reference signal samples based on the analog reference signal; and at least one digital signal processor coupled to the at least two analog-to-digital converters for digitally processing each first and second set of the digital measurement signal waveform samples and the digital reference signal waveform samples, the at least one digital signal processor configured to generate digital measurement phase data representing an instantaneous phase of the analog measurement signal, the at least one digital signal processor configured to generate digital reference phase data representing an instantaneous phase of the analog reference signal.

33. The displacement measuring interferometry system of claim 32, wherein the optics for generating a quadrature optical measurement signal further comprises:

a non-polarizing beam splitter for splitting the at least one light beam into a first light beam and a second light beam, the at least one light beam, first light beam, and second light beam comprising first and second frequency components orthogonally linearly polarized;

a quarter wave plate in the path of the first light beam, the quarter wave plate for changing the orthogonally linearly polarized light to orthogonally circularly polarized light;

a first polarizer in the path of the first light beam, the first polarizer for changing the orthogonally circularly polarized light to linearly polarized light; and a second polarizer in the path of the second light beam, the second polarizer for changing the orthogonally linearly polarized light to linearly polarized light.

34. The displacement measuring interferometry system of claim 33, wherein a fast access of the quarter wave plate is set at approximately 45 degrees to the orthogonally polarized components in the first light beam.

35. The displacement measuring interferometry system of claim 33, wherein a polarizer axis of the first polarizer is oriented at approximately 45 degrees to a fast access of the quarter wave plate.

36. The displacement measuring interferometry system of claim 33, wherein a polarizer axis of the second polarizer is oriented at approximately 45 degrees to the orthogonally polarized components in the first light beam.

37. The displacement measuring interferometry system of claim 33, wherein a phase difference between the linearly polarized light of the first light beam exiting the first polarizer and the linearly polarized light of the second light beam exiting the second polarizer is approximately 90 degrees.

38. The displacement measuring interferometry system of claim 32, wherein the digital measurement phase data represents a phase progression of the analog measurement signal, and wherein the digital reference phase data represents a phase progression of the analog reference signal.

39. The displacement measuring interferometry system of claim 32, wherein the digital processing performed by the digital signal processor is based on a block regression technique, wherein linear regression processing is performed on sums of digital signal waveform samples.

* * * * *

UNITED STATES PATENT AND TRADEMARK OFFICE
CERTIFICATE OF CORRECTION

PATENT NO.   : 6,952,175 B2
DATED        : October 4, 2005
INVENTOR(S)  : Chu et al.

It is certified that error appears in the above-identified patent and that said Letters Patent is hereby corrected as shown below:

Column 15,
Line 24, delete "ofthefirst" and insert -- of the first --.
Line 48, after "V*cos" delete "[2τ" and insert -- :[2π --.
Line 55, delete "[2τ(Freq*i-θ+Δθ)]" and insert -- [2π(*Freq*i-θ+Δθ)] --.
Line 59, delete "Δθrepresent" and insert -- Δθ represent --.

Column 17,
Line 36, delete "result-value" and insert -- result value --.

Signed and Sealed this

Seventh Day of February, 2006

JON W. DUDAS
*Director of the United States Patent and Trademark Office*